United States Patent
Sato

(10) Patent No.: US 6,897,864 B2
(45) Date of Patent: May 24, 2005

(54) METHOD AND PROGRAM FOR COORDINATE DECISION PROCEDURE OF VOXEL MODEL, AND RECORDING MEDIUM THEREOF

(75) Inventor: Minoru Sato, Nagano (JP)

(73) Assignee: Fujitsu Nagano Systems Engineering Limited, Nagano (JP)

(*) Notice: Subject to any disclaimer, the term of this patent is extended or adjusted under 35 U.S.C. 154(b) by 71 days.

(21) Appl. No.: 10/107,394

(22) Filed: Mar. 28, 2002

(65) Prior Publication Data

US 2002/0167517 A1 Nov. 14, 2002

(30) Foreign Application Priority Data

Mar. 30, 2001 (JP) ........................................ 2001-098340

(51) Int. Cl.[7] .............................................. G06T 17/00
(52) U.S. Cl. ...................................................... 345/424
(58) Field of Search ................................. 345/424, 650, 345/653

(56) References Cited

U.S. PATENT DOCUMENTS

2001/0031920 A1 * 10/2001 Kaufman et al. ........... 600/431

* cited by examiner

*Primary Examiner*—Almis Jankus
(74) *Attorney, Agent, or Firm*—Staas & Halsey LLP

(57) ABSTRACT

A VOXEL model generating unit generates a VOXEL model of an analysis object, and an inertia principal axes computing unit computes a center of gravity and principal axes of inertia. A three-dimensional CAD data rotating unit rotates the VOXEL model around one axis of the principal axes of inertia to generate the rotated VOXEL models, thereby finding the VOXEL model with the least volume error between an actual volume $V_c$ of an analysis object calculated for a three-dimensional CAD model and a volume $V_v$ of the VOXEL model. The coordinate system of the VOXEL model at this time is defined for VOXEL coordinates.

5 Claims, 4 Drawing Sheets

LONGITUDINAL DIRECTION OF STRUCTURE

DEFINITION OF XYZ COORDINATE SYSTEM WITH I1 AS X-AXIS

METHOD AND PROGRAM FOR COORDINATE DECISION PROCEDURE OF VOXEL MODEL, AND RECORDING MEDIUM THEREOF

BACKGROUND OF THE INVENTION

1. Field of the Invention

The present invention relates to a method and program for coordinate decision procedure of VOXEL model and a recording medium thereof, and more particularly to a method and program for coordinate decision procedure of VOXEL model and a recording medium which are employed in a structure analysis using a computer for computing physical quantities such as stress, deformation and thermal conduction in the structure of various shapes, relying on the VOXEL method, in which the error between the volume of a three-dimensional CAD model for an analysis object and the volume of a VOXEL model is made as small as possible.

2. Description of the Related Art

Conventionally, in the structure analysis problem for computing the physical quantities such as stress, deformation and thermal conduction in a structure, the structure was approximated by an aggregate of small rectangular parallelepipeds, each called a VOXEL, to calculate the physical quantities such as stress, deformation and thermal conduction for its approximate model using the VOXEL method (finite element method, iteration method).

In generating a VOXEL model of an analysis object, the coordinate system for making the VOXEL division of the analysis object should be decided. Conventionally, this VOXEL coordinate system was appropriately set up by an analysis engineer based on the intuition and experience.

In the structure analysis method relying on the VOXEL method, to attain the calculation precision, it was necessary to reduce an approximation error by making each size of VOXEL as small as possible. However, there is a limit in reducing the size of VOXEL due to the constraints of hardware resources such as the CPU time or memory amount of computer.

In the structure analysis for computing the physical quantities such as stress, deformation and thermal conduction of a structure, the computation method relying on the VOXEL method involves making the computation of physical quantities such as stress, deformation and thermal conduction, employing the VOXEL model approximated by an aggregate of rectangular parallelepipeds of uniform element shape, each called a VOXEL. Therefore, there is an error between the actual volume of the analysis object and the volume of the VOXEL model, leading to errors in the calculated physical quantities such as stress, deformation and thermal conduction, resulting in the analysis with poor precision to compute the untrue values.

Since in setting up the VOXEL coordinates to generate the VOXEL model of the analysis object, the analysis engineer set up the appropriate coordinate system based on the intuition and experience, the error between the actual volume of the analysis object and the volume of the VOXEL model was not too small.

However, if the VOXEL size is reduced more than needed to increase the analysis precision, there is a problem that the analysis process is inoperable because of insufficient machine resources such as the CPU time or memory, and the desired result cannot be obtained, whereby the minimum of VOXEL size was limited.

SUMMARY OF THE INVENTION

It is an object of the present invention to solve the above-mentioned problems, and to provide a VOXEL model coordinate decision processing (or procedure) method and program and a recording medium thereof, in which the reliability of analysis result is assured as an entire model by increasing the analysis precision in a VOXEL size analyzable with the machine resources actually employed in an analysis process.

Also, it is another object of the present invention to provide a VOXEL model coordinate deciding program that implements the VOXEL model coordinate decision processing method.

Further, it is another object of the present invention to provide a recording medium that records the VOXEL model coordinate deciding program that implements the VOXEL model coordinate decision processing method.

A VOXEL model coordinate decision processing method of the present invention for making the structure analysis of a modeled analysis object, using the VOXEL method. The method comprises a first step of calculating a volume error between the actual volume of the analysis object and the volume of a VOXEL model generated in a certain coordinate system, a second step of rotating the analysis object around an axis of the coordinate system for making the VOXEL division of the analysis object and generating a new VOXEL model of the rotated analysis object, a third step of calculating a new volume error between the actual volume of the analysis object and the volume of the rotated VOXEL model, a fourth step of comparing the previous volume error and the new volume error and selecting the VOXEL model with smaller volume error, and a fifth step of repeating the second to fourth steps a predetermined number of times to adopt the coordinate system of the VOXEL model finally selected as the VOXEL coordinates.

Also, a VOXEL model coordinate deciding program of the present invention is executed on the computer to implement the VOXEL model coordinate decision processing method.

Further, a VOXEL model coordinate deciding program recording medium of the present invention is a computer readable recording medium for recording the VOXEL model coordinate deciding program.

Also, another VOXEL model coordinate decision processing method of the present invention for making the structure analysis of a modeled analysis object, using the VOXEL method. The method comprises a first step of calculating a volume error between the actual volume of the analysis object and the volume of a VOXEL model generated in a certain coordinate system, a second step of acquiring the principal axes of inertia of the analysis object from the VOXEL model, a third step of rotating the analysis object around one axis of the coordinate system, which is a longitudinal axis of the analysis object among the principal axes of inertia, and generating a new VOXEL model of the rotated analysis object, a fourth step of calculating a new volume error between the actual volume of the analysis object and the volume of the rotated VOXEL model, a fifth step of comparing the previous volume error and the new volume error and selecting the VOXEL model with smaller volume error, and a sixth step of repeating the third to fifth steps a predetermined number of times to adopt the coordinate system of the VOXEL model finally selected as the VOXEL coordinates.

Also, another VOXEL model coordinate deciding program of the present invention is executed on a computer to implement the VOXEL model coordinate decision processing method.

Further, another VOXEL model coordinate deciding program recording medium of the present invention is a computer readable recording medium for recording the VOXEL model coordinate deciding program.

DETAILED DESCRIPTION OF THE PREFERRED EMBODIMENTS

The present invention has a feature of deciding an axis on a three-dimensional CAD model of an analysis object, generating a plurality of VOXEL models by rotating the three-dimensional CAD model around the axis as a rotation axis by a small amount every time, acquiring a VOXEL model with the least volume error among the plurality of VOXEL models, and deciding a coordinate system for the VOXEL model as the coordinate system for use with the structure analysis, to solve the above-mentioned problems.

Also, the present invention has another feature of acquiring a VOXEL model with small volume error, and displaying the VOXEL model to be easily seen, using the principal axis of inertia in the longitudinal direction of the analysis object as the rotation axis on the three-dimensional CAD model, because most of the actual analysis objects are symmetrical with respect to the longitudinal axis.

The above processing can be realized by a computer and a software program, in which the program can be stored in a suitable recording medium such as a computer readable portable medium memory, a semiconductor memory or a hard disk.

Figure 1:
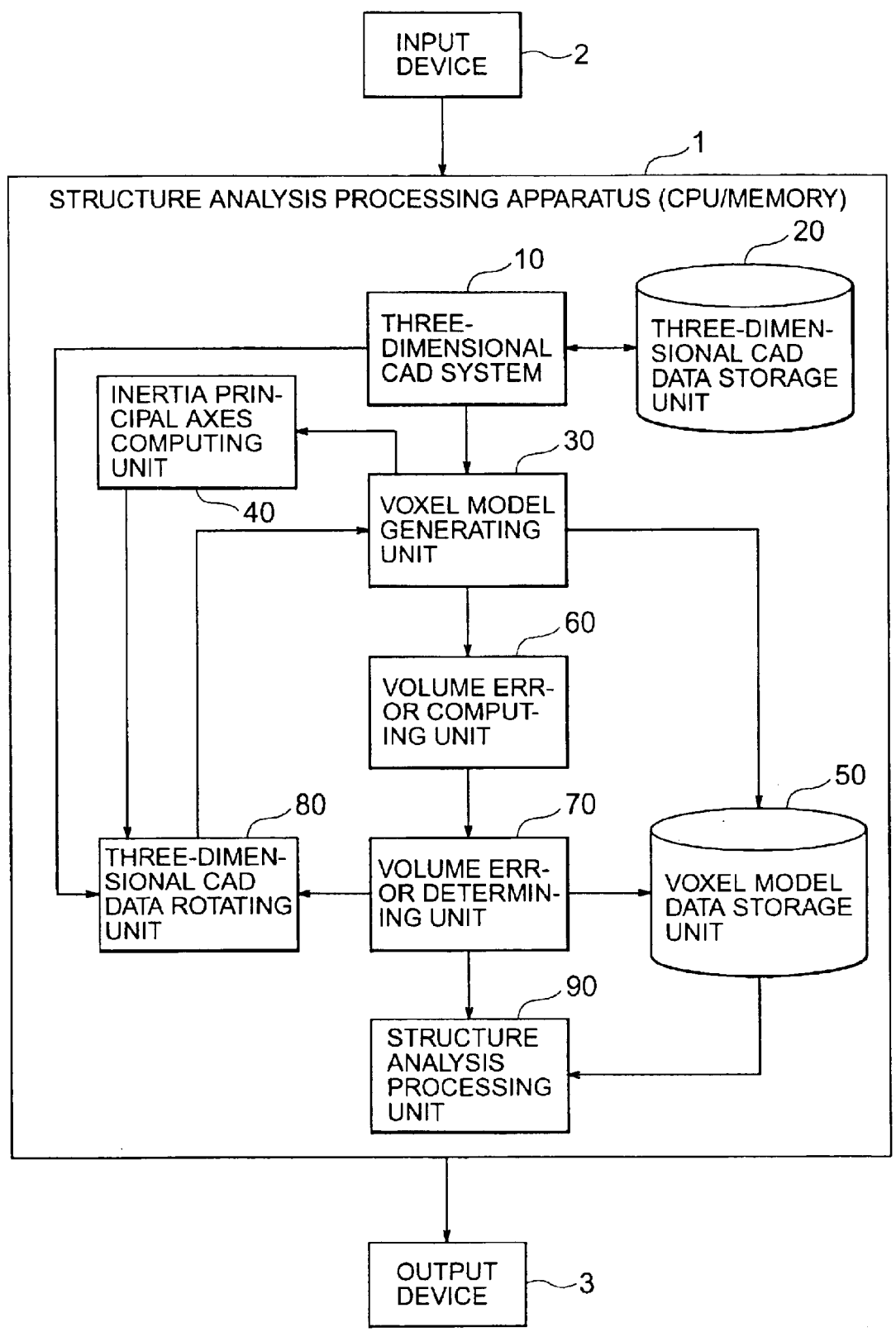
FIG. 1 is a diagram showing a configuration example of a system that realizes the present invention.

The preferred embodiments of the present invention will be described below in detail with reference to the accompanying drawings. FIG. 1 is a diagram showing a configuration example of the system for realizing the present invention. A structure analysis processing apparatus 1 is a computer having a CPU and a memory, and comprises a three-dimensional CAD system 10 composed of software programs, a three-dimensional CAD data storage unit 20, a VOXEL model generating unit 30, an inertia principal axes computing unit 40, a VOXEL model data storage unit 50, a volume error computing unit 60, a volume error determining unit 70, a three-dimensional CAD data rotating unit 80, and a structure analysis processing unit 90. The structure analysis processing apparatus 1 has an input device 2 and an output device 3 connected thereto.

The structure analysis processing apparatus 1 inputs the analysis object data from the input device 2, and the three-dimensional CAD system 10 stores the input analysis object data as the three-dimensional CAD data in the three-dimensional CAD data storage unit 20. Also, the three-dimensional CAD system 10 computes the volume $V_c$ of the three-dimensional CAD model for the analysis object from the three-dimensional CAD data.

The VOXEL model generating unit 30 inputs the three-dimensional CAD (model) data from the three-dimensional CAD system 10, and generates a VOXEL model by dividing the data into finite elements of sufficiently small VOXELs. At this time, the coordinate system of the VOXEL model is made coincident with the coordinate system of the three-dimensional CAD model. The generated VOXEL model is stored as the VOXEL model data in the VOXEL model data storage unit 50.

Figure 2A:
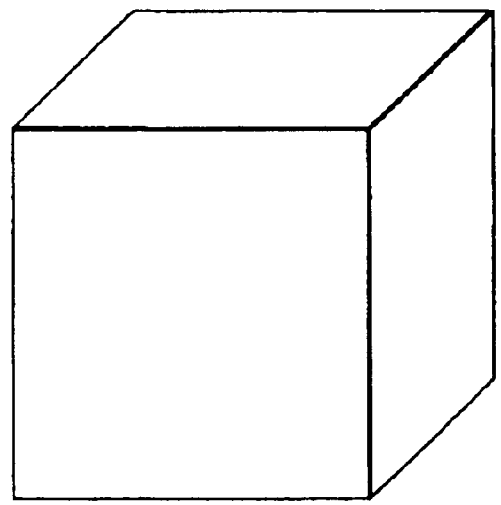
FIG. 2 is a view showing an example of a three-dimensional CAD data of an analysis object and an example of the VOXEL model.
Figure 2B:
Figure 2B:
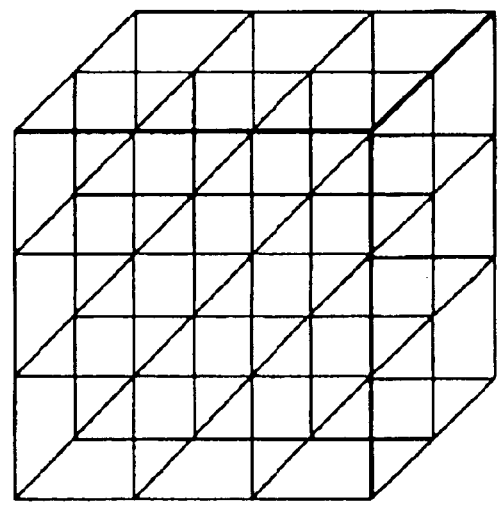

FIG. 2 is a view showing the examples of the three-dimensional CAD data of the analysis object and its VOXEL model. The three-dimensional CAD data of the analysis object as shown in FIG. 2A is divided into finite elements of a certain VOXEL size to generate the VOXEL model as shown in FIG. 2B.

When the first VOXEL model is generated, the inertia principal axes computing unit 40 computes the principal axes of inertia from the center of gravity by acquiring the center of gravity from the VOXEL model. The computation of the center of gravity and the principal axes of inertia is a physical or mathematical problem. Away of the computation is not described in detail. Though the computation is very complex in the general model, the shape of VOXEL elements is uniform in the VOXEL model, whereby the center of gravity can be easily specified, and the principal axes of inertia can be easily computed.

The volume error computing unit 60 computes a volume error $\epsilon$ between the volume $V_v$ of the VOXEL model and the volume $V_c$ of the three-dimensional CAD model by calculating the volume $V_v$ of the VOXEL model from the generated VOXEL model. For the first VOXEL model, the volume error $\epsilon$ is defined as $\epsilon_{min}$. The volume error $\epsilon$ is obtained in the following expression.

$$\epsilon = |V_c - V_v|/V_c (\epsilon_{min} = \epsilon \text{ only for the first time})$$

The volume error determining unit 70 transfers the processing to the three-dimensional CAD data rotating unit 80, when the VOXEL model is generated at the first time.

The three-dimensional CAD data rotating unit 80 inputs the three-dimensional CAD data stored in the three-dimensional CAD data storage unit 20 from the three-dimensional CAD system 10, and inputs the principal axes of inertia and the coordinate data of the inertia principal axes and the center of gravity from the inertia principal axes computing unit 40. At this time, the principal axis of inertia in the longitudinal direction is used. The three-dimensional CAD data rotating unit 80 sets up a coordinate system where the input center of gravity is the origin and the principal axis of inertia is the X-axis (the Y-axis and the Z-axis being orthogonal to the X-axis), and rotates the three-dimensional CAD data model by a predetermined angle around the X-axis. That is, for the three-dimensional CAD model, the Y-axis and the Z-axis orthogonal to the X-axis are rotated around the X-axis as the central axis. After rotation, the three-dimensional CAD data rotating unit 80 passes the three-dimensional CAD data rotated to the VOXEL model generating unit 30.

Figure 3A:
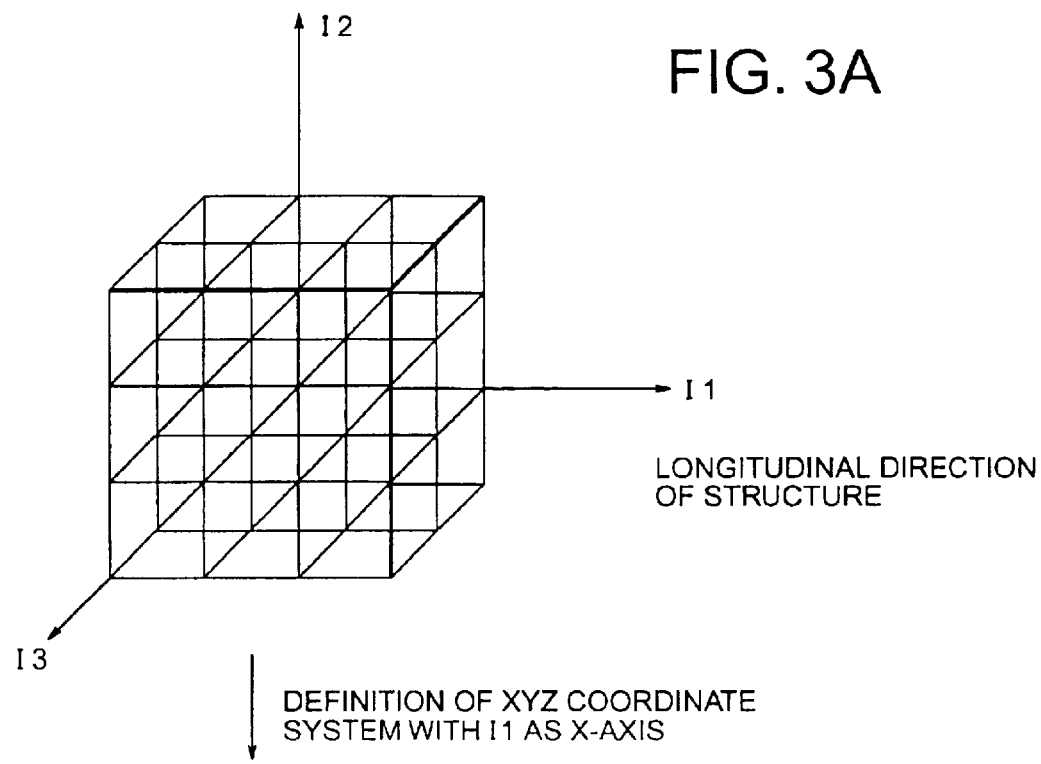
FIG. 3 is a view showing an example of a principal axes of inertia in the VOXEL model of the analysis object and an example of rotation of the three-dimensional CAD data around an X-axis.
Figure 3B:
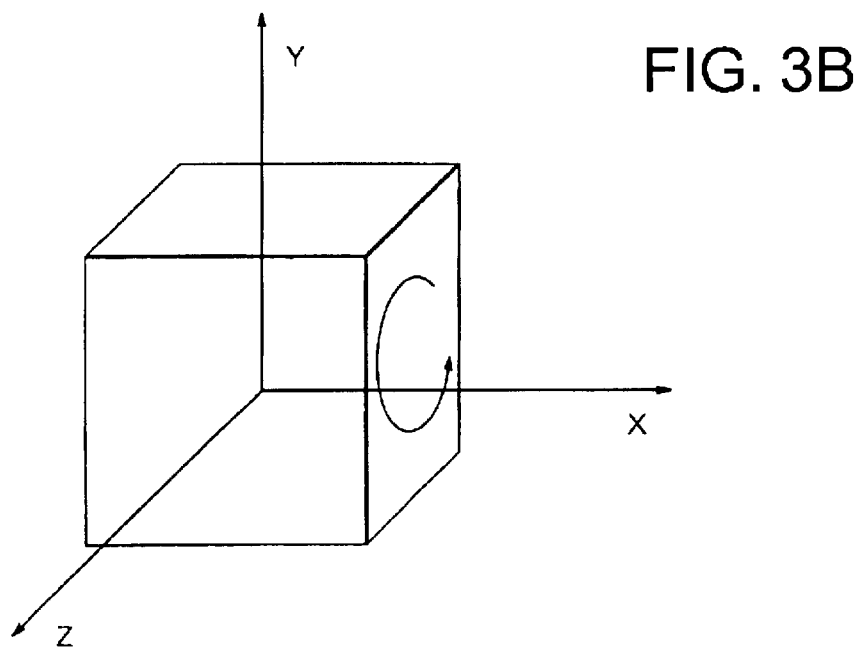

FIG. 3 shows an example of the principal axes of inertia in the VOXEL model of the analysis object, and an example in which the three-dimensional CAD data is rotated around the X-axis. For instance, suppose that three principal axes of inertia I1, I2 and I3 are obtained for the VOXEL model of the analysis object as shown in FIG. 3A. At this time, if the principal axis of inertia I1 is in the longitudinal direction, for example, the principal axis of inertia I1 is set as the X-axis, the XYZ coordinate system is set up with the center of gravity as the origin, and the three-dimensional CAD data is rotated around the X-axis that is the axis of rotation, as shown in FIG. 3B.

The VOXEL model generating unit 30 generates a new VOXEL model by making the VOXEL division of the three-dimensional CAD data after rotation along the XYZ coordinate system. Thereafter, the processings of the VOXEL model generating unit 30, the volume error computing unit 60, the volume error determining unit 70, and the three-dimensional CAD data rotating unit 80 are repeated till a predetermined number of rotations are ended.

In the case where the VOXEL model is at the second time and later, the volume error determining unit 70 compares the volume errors of two VOXEL models (volume error $\epsilon_{min}$, of the previous VOXEL model and volume error $\epsilon$ of the new VOXEL model). If $\epsilon_{min}$ is greater than $\epsilon$, the previous VOXEL model data within the VOXEL model data storage unit 50 is updated with the new VOXEL model data, and $\epsilon_{min}$ is updated with $\epsilon$. If $\epsilon_{min}$ is less than or equal to $\epsilon$, none of the VOXEL model data and $\epsilon_{min}$ are updated.

The above-mentioned processings are repeated till a predetermined number of rotations are ended. Thereafter, the operation transfers to the structure analysis processing unit 90 to make the structure analysis process. Alternatively, The computation of volume error with the rotation of the three-dimensional CAD data is not repeated till a predetermined number of rotations are ended, but it is checked whether or not the volume error is within a range of error tolerance, and the operation may transfer to the structure analysis processing unit 90, if the volume error falls within the range of error tolerance, even though the predetermined number of rotations are not ended. The VOXEL model data stored in the VOXEL model data storage unit 50 at this time is the VOXEL model data with the least volume error among the rotated VOXEL models. The XYZ coordinate system at this time is defined as the coordinate system for the VOXEL model.

The structure analysis processing unit 90 inputs the VOXEL model data from the VOXEL model data storage unit 50, performs the structure analysis, and outputs the result from the output device 3. The structure analysis process by the VOXEL method relying on the finite element method is a well-known technique, and is not described here.

Figure 4:
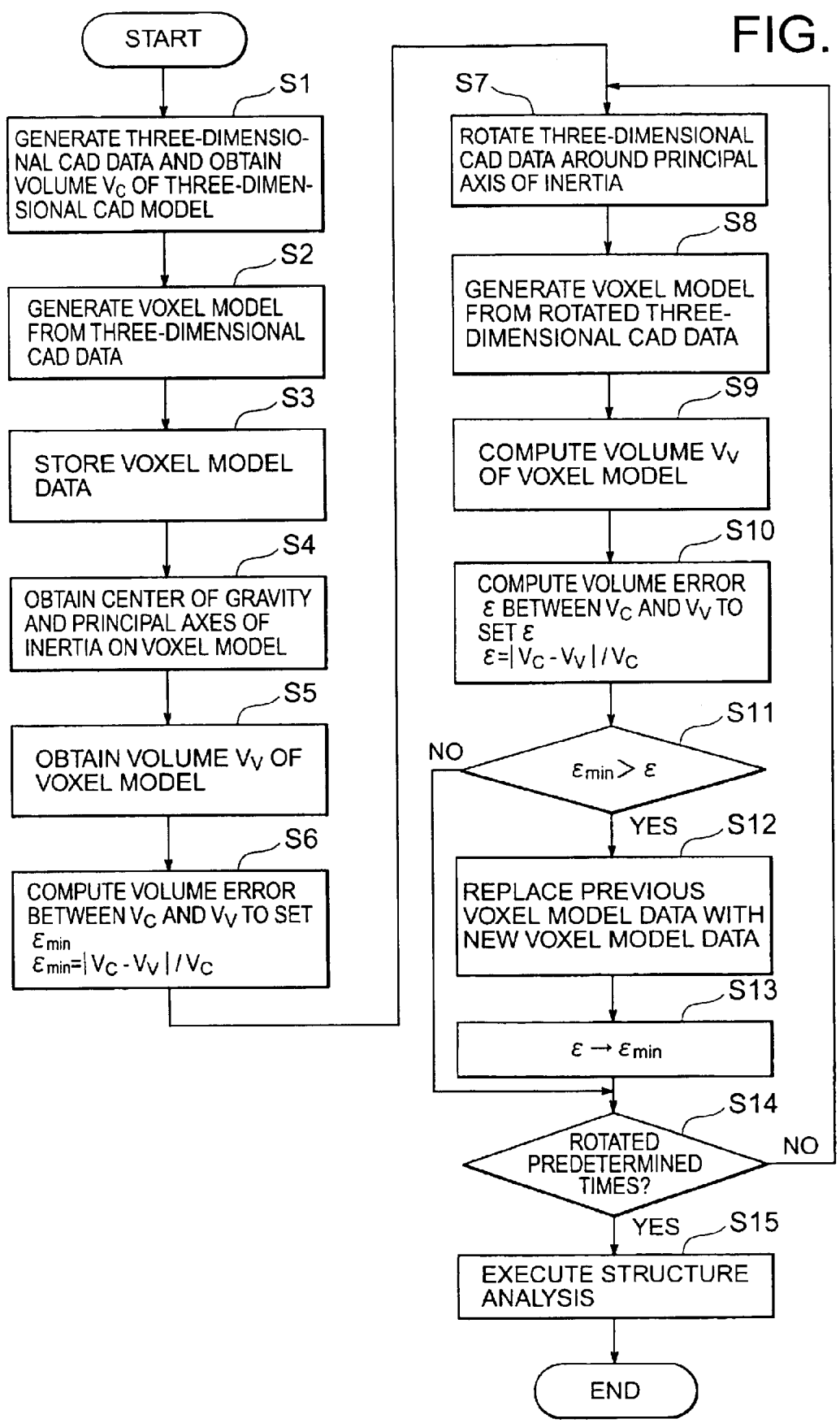
FIG. 4 is a flowchart showing a process of the VOXEL model coordinates decision according to an embodiment of the present invention.

FIG. 4 is a flowchart showing a process of the VOXEL model coordinates decision according to an embodiment of the present invention. The three-dimensional CAD system 10 generates the three-dimensional CAD data of the analysis object, and obtains the volume $V_c$ of its three-dimensional CAD model (step S1). The VOXEL model generating unit 30 generates the VOXEL model divided into finite elements from the three-dimensional CAD data of analysis object (step S2). Then, the VOXEL model data is stored in the VOXEL model data storage unit 50 (step S3). Also, the inertia principal axes computing unit 40 computes the center of gravity and the principal axes of inertia from the VOXEL model data (step S4). The volume error computing unit 60 computes the volume $V_v$ of the VOXEL model (step S5), and computes a volume error between $V_c$ and $V_v$ to set it as $\epsilon_{min}$ (step S6).

The three-dimensional CAD data rotating unit 80 chooses the X-axis in the longitudinal direction from the principal axes of inertia computed by the inertia principal axes computing unit 40, sets up the XYZ coordinate system with the center of gravity as the origin, and rotates the three-dimensional CAD data around the X-axis (step S7). The VOXEL model generating unit 30 generates a new VOXEL model from the three-dimensional CAD data rotated (step S8). The volume error computing unit 60 computes the volume $V_v$ of the new VOXEL model from the new VOXEL model data (step S9), and computes the volume error $\epsilon$ of the rotated analysis object from the volume $V_c$ of the three-dimensional CAD model and the new volume $V_v$ (step S10).

The volume error determining unit 70 compares $\epsilon_{min}$ and $\epsilon$ (step S11), and if $\epsilon_{min}$ is smaller than or equal to $\epsilon$, the operation directly proceeds to step S14, or if $\epsilon_{min}$ is greater than $\epsilon$, the VOXEL model data stored in the VOXEL model data storage unit 50 is replaced by the VOXEL model data of the rotated analysis object (step S12), and the volume error $\epsilon$ is the minimum volume error $\epsilon_{min}$ (step S13). The volume error determining unit 70 determines whether or not the analysis object is rotated by a predetermined number of times (step S14), and if the predetermined number of rotations is not reached, the operation returns to step S7, or if the analysis object is rotated by the predetermined number of times, the structure analysis processing unit 90 performs the structure analysis (step S15) to output the result of analysis, and the operation is ended.

As described above, in setting up the VOXEL coordinates with the VOXEL method in the structure analysis problem for computing the physical quantities such as stress, deformation and thermal conduction in the structure, with the present invention, unlike the conventional method in which the appropriate coordinate system was set up by the analysis engineer based on the intuition and experience, the VOXEL models are generated in different coordinate systems, and the VOXEL model with the least volume error is chosen from among the generated VOXEL models to make the structure analysis, whereby the structure analysis can be made with high precision even if there is a limit in the minimum VOXEL size.

What is claimed is:

1. A VOXEL model coordinate decision processing method of making a structure analysis of a modeled analysis object, using a VOXEL method, the method comprising:

a first step of calculating a volume error between an actual volume of the analysis object and a volume of a VOXEL model generated in a certain coordinate system;

a second step of rotating the analysis object around an axis of the coordinate system to make a VOXEL division of the analysis object and generating a VOXEL model of a newly rotated analysis object;

a third step of calculating a new volume error between the actual volume of the analysis object and the volume of the rotated VOXEL model;

a fourth step of comparing a previous volume error and a new volume error and selecting the VOXEL model with smaller volume error, and a fifth step of repeating the second to fourth steps until the smaller volume error is within a range of error tolerance, and adopting the coordinate system of the VOXEL model finally selected as the VOXEL coordinates, the finally selected VOXEL model having the least volume error among a plurality of rotated VOXEL models, and the volume error of the finally selected VOXEL model being within the range of error tolerance.

2. A VOXEL model coordinate decision processing method of making a structure analysis of a modeled analysis object, using a VOXEL method, the method comprising:

a first step of calculating a volume error between an actual volume of the analysis object and a volume of a VOXEL model generated in a certain coordinate system;

a second step of acquiring the principal axes of inertia of the analysis object from the VOXEL model;

a third step of rotating the analysis object around one axis of the coordinate system, which is a longitudinal axis of the analysis object among the principal axes of inertia, and generating a VOXEL model of a newly rotated analysis object;

a fourth step of calculating a new volume error between the actual volume of the analysis object and the volume of the rotated VOXEL model;

a fifth step of comparing a previous volume error and a new volume error and selecting the VOXEL model with smaller volume error; and a sixth step of repeating the third to fifth steps until the smaller volume error is within a range of error tolerance, and adopting the coordinate system of the VOXEL model finally selected as the VOXEL coordinates, the finally selected VOXEL model having the least volume error among a plurality of rotated VOXEL models, and the volume error of the finally selected VOXEL model being within the range of error tolerance.

3. A VOXEL model coordinate deciding program recording medium that records a program being executed on a computer to make a structure analysis of a modeled analysis object, using a VOXEL method:

wherein the program causes the computer to execute:

a first processing of calculating a volume error between an actual volume of the analysis object and a volume of a VOXEL model generated in a certain coordinate system;

a second processing of rotating the analysis object around an axis of the coordinate system to make the VOXEL division of the analysis object and generating a VOXEL model of a newly rotated analysis object;

a third processing of calculating a new volume error between the actual volume of the analysis object and the volume of the rotated VOXEL model;

a fourth processing of comparing a previous volume error and the new volume error and selecting the VOXEL model with smaller volume error; and a fifth processing of repeating the second to fourth processings until the smaller volume error is within a range of error tolerance, and adopting the coordinate system of the VOXEL model finally selected as the VOXEL coordinates, the finally selected VOXEL model having the least volume error among a plurality of rotated VOXEL models, and the volume error of the finally selected VOXEL model being within the range of error tolerance.

4. A VOXEL model coordinate deciding program recording medium that records a program being executed on a computer to make a structure analysis of a modeled analysis object, using a VOXEL method:

wherein the program causes the computer to execute:

a first processing of calculating a volume error between an actual volume of the analysis object and a volume of a VOXEL model generated in a certain coordinate system;

a second processing of acquiring the principal axes of inertia of the analysis object from the VOXEL model;

a third processing of rotating the analysis object around one axis of the coordinate system, which is a longitudinal axis of the analysis object among the principal axes of inertia, and generating a new VOXEL model of the rotated analysis object;

a fourth processing of calculating a new volume error between the actual volume of the analysis object and the volume of the rotated VOXEL model;

a fifth processing of comparing the previous volume error and the new volume error and selecting the VOXEL model with smaller volume error, and a sixth processing of repeating the third to fifth processings until the smaller volume error is within a range of error tolerance, and adopting the coordinate system of the VOXEL model finally selected as the VOXEL coordinates, the finally selected VOXEL model having the least volume error among a plurality of rotated VOXEL models, and the volume error of the finally selected VOXEL model being within the range of error tolerance.

5. A VOXEL model coordinate decision processing method of making a structure analysis of a modeled analysis object, using a VOXEL method, the method comprising:

rotating an analysis object about an axis of a coordinate system to create a rotated VOXEL model of the analysis object;

comparing a calculated volume error of the rotated VOXEL model relative to an actual volume of the analysis object with a previously calculated volume error and selecting the rotated VOXEL model if the calculated volume error is less than the previously calculated volume error; and repeating the rotating and the comparing until the volume error of the selected VOXEL model is within a range of error tolerance, wherein the volume error of the VOXEL model is least among a plurality of rotated VOXEL models and is within the range of error tolerance.

* * * * *

UNITED STATES PATENT AND TRADEMARK OFFICE
CERTIFICATE OF CORRECTION

PATENT NO. : 6,897,864 B2  Page 1 of 1
APPLICATION NO. : 10/107394
DATED : May 24, 2005
INVENTOR(S) : Minoru Sato It is certified that error appears in the above-identified patent and that said Letters Patent is hereby corrected as shown below:

Column 6, line 51, (claim 1, line 17) affter "error" change "," to --;--.

Column 8, line 23, (claim 4, line 22) after "error" change "," to --;--.

Signed and Sealed this

Twenty-eighth Day of November, 2006

JON W. DUDAS
*Director of the United States Patent and Trademark Office*